(12) United States Patent
Kang

(10) Patent No.: US 7,952,921 B2
(45) Date of Patent: May 31, 2011

(54) 1-TRANSISTOR TYPE DRAM CELL, DRAM DEVICE AND DRAM COMPRISING THEREOF AND DRIVING METHOD THEREOF AND MANUFACTURING METHOD THEREOF

(75) Inventor: Hee Bok Kang, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/762,493

(22) Filed: Apr. 19, 2010

(65) Prior Publication Data
US 2010/0195427 A1    Aug. 5, 2010

Related U.S. Application Data

(62) Division of application No. 11/781,433, filed on Jul. 23, 2007, now Pat. No. 7,733,707.

(30) Foreign Application Priority Data

| Jul. 21, 2006 | (KR) | 10-2006-0068750 |
| Aug. 9, 2006 | (KR) | 10-2006-0075413 |
| Aug. 9, 2006 | (KR) | 10-2006-0075414 |
| Aug. 9, 2006 | (KR) | 10-2006-0075415 |

(51) Int. Cl.
*G11C 11/34* (2006.01)

(52) U.S. Cl. ........................................ 365/184; 365/176
(58) Field of Classification Search .................. 365/184, 365/176, 154, 230.06
See application file for complete search history.

(56) References Cited

U.S. PATENT DOCUMENTS

| 7,123,509 B2 * | 10/2006 | Ohsawa | 365/184 |
| 7,177,175 B2 * | 2/2007 | Fazan et al. | 365/149 |

* cited by examiner

*Primary Examiner* — Vu A Le
(74) *Attorney, Agent, or Firm* — Ladas & Parry LLP

(57) ABSTRACT

The present invention relates to a semiconductor device, and more precisely to an 1-transistor type DRAM cell implemented using bulk silicon, a DRAM device and a DRAM comprising thereof and a driving method thereof and a manufacturing method thereof. The driving method of an 1-transistor type DRAM comprises: a data hold process biasing a word line at a negative voltage level and biasing a sensing line and a bit line at a first constant voltage level; a data purging process resetting data by biasing the word line at a second constant voltage level and biasing the sensing line and the bit line at the first constant voltage level; and a data write process allowing a write current to be flowed from the bit line to a floating body by rasing the bit line to the second constant voltage level and raising the sensing line to the half second constant voltage level, while maintaining the bias of the word line at the second constant voltage level.

4 Claims, 22 Drawing Sheets

STORE "1"

STORE "0"

US 7,952,921 B2

1-TRANSISTOR TYPE DRAM CELL, DRAM DEVICE AND DRAM COMPRISING THEREOF AND DRIVING METHOD THEREOF AND MANUFACTURING METHOD THEREOF

CROSS-REFERENCE TO RELATED APPLICATIONS

The present application claims priority to Korean patent application numbers 10-2006-0068750 filed on Jul. 21, 2006, 10-2006-0075413 filed on Aug. 9, 2006, 10-2006-0075414 filed on Aug. 9, 2006 and 10-2006-0075415 filed on Aug. 9, 2006 which are incorporated herein by reference in their entirety.

BACKGROUND OF THE INVENTION

The present invention relates to a semiconductor device, and more specifically to an 1-transistor type DRAM cell, a DRAM device and a DRAM comprising thereof and a driving method thereof and a manufacturing method thereof.

A semiconductor device such as a DRAM is generally integrated on a silicon wafer. However, for the silicon wafer used in the semiconductor device, the whole silicon is not used in the operation of the device but only the silicon limited to the thickness of several μm from the surface thereof is used in the operation of the device. After all, the remaining silicon wafer excepting a portion required in the operation of the device becomes a factor increasing power consumption and decreasing driving speed.

Therefore, the necessity of a silicon on insulator (SOI) wafer constituted by forming a silicon single crystal layer of a thickness of several μm by interposing an isolating layer on the silicon substrate has become an issue and the semiconductor device integrated on the SOI wafer is capable of being operated at a high speed by means of less junction capacity and at a low-voltage by means of the a low threshold voltage, as compared to the semiconductor device integrated on a general silicon wafer. Such a semiconductor device integrated on the SOI wafer has been reported.

FIG. 1 is cross-sectional view showing a DRAM cell implemented on a SOI wafer of the prior art. In FIG. 1, a SOI wafer 10 is formed in a stacked structure of a silicon substrate 1, a buried oxide film 2, and a silicon layer 3, and a device isolating layer 11 defining an active region on the silicon layer 3 of such a SOI wafer 10 is formed to contact the buried oxide film 2, wherein in the upper of the active region of the silicon layer 3 a gate 12 is formed and source/drain regions 13a and 13b are formed to contact the buried oxide film 2 within the silicon layers 3 on both sides of the gate 12.

In the DRAM cell implemented on the SOI wafer 10, data store is made by means of holes and electrons captured by a floating body corresponding to a channel region below the gate 12.

For example, as shown in FIG. 2a, a store "1" state can be appreciated as the state where there are a few holes in the floating body, and as shown in FIG. 2b, a store "0" state can be appreciated as the state where there are few hole in the floating body or there are a few electrons therein. And, in a read state, the more amount of sensing current flows when an 1-transistor type cell is in the store "1" than in the store "0".

FIG. 3 is a graph showing a cell read current when a cell drain voltage Vd is 0.2V, a cell source voltage is ground GND and a cell gate voltage is swept, for a DRAM cell implemented on a SOI wafer of the prior art.

As shown, current is largest in a store "1" state, current is smallest in a store "0" state, and a reference voltage is positioned in the intermediate therebetween.

As described above, there is a problem that a driving method of a floating body type 1-transistor type DRAM cell capable of efficiently writing and reading data in a low voltage state should be proposed.

Also, there is a further problem that a method capable of stably driving a SOI 1-transistor type DRAM cell and a cell array thereof should be proposed.

Also, when implementing a semiconductor device applying the SOI wafer, there is an advantage of the device characteristics as described above, however, the SOI wafer is more expensive than a general silicon wafer so that it is not preferable in view of productivity.

In particular, when manufacturing a semiconductor device using the SOI wafer, the existing equipments and processes are designed to be suitable for the case applying the silicon wafer so that the modification of the manufacturing equipments and processes and the development thereof are also required. Therefore, it is substantially difficult to use the manufacturing of the semiconductor device applying the SOI wafer.

SUMMARY OF THE INVENTION

There is provided a driving method of an 1-transistor type DRAM cell implemented using a bulk silicon capable of writing and reading data in a low voltage state.

And, there is provided an array and a driving method thereof implemented using the 1-transistor type DRAM cell implemented using the bulk silicon.

Also, there is provided a DRAM cell, a DRAM comprising thereof, and a manufacturing method thereof, capable of preventing the reduction of productivity using a silicon substrate formed of the bulk silicon.

Also, there is provided a DRAM cell, a DRAM comprising thereof, and a manufacturing method thereof, capable of obtaining easiness and reliability of a manufacturing process since equipments and processes designed to be suitable for the case where the existing silicon substrate is applied can be applied.

According to the present invention, there is provided a driving method of an 1-transistor type DRAM comprising: a data hold process biasing a word line at a negative voltage level and biasing a sensing line and a bit line at a first constant voltage level; a data purging process resetting data by biasing the word line at a second constant voltage level and biasing the sensing line and the bit line at the first constant voltage level; and a data write process allowing a write current to be flowed from the bit line to a floating body by rasing the bit line to the second constant voltage level and raising the sensing line to the half second constant voltage level, while maintaining the bias of the word line at the second constant voltage level.

Herein, the present invention can further comprise, after the data write process, a second data hold process holding the write data by biasing the word line at the negative voltage level. And, the write data may be digital logic 0 or 1.

According to the present invention, there is provided a driving method of an 1-transistor type DRAM comprising: a data hold process biasing a word line at a negative voltage level and biasing a sensing line and a bit line at a first constant voltage level; a data purging process resetting data by biasing the word line at a second constant voltage level and biasing the sensing line and the bit line at the first constant voltage level; and a data write process allowing a write current to be flowed from a floating body to the bit line by maintaining the bit line at the first constant voltage level and raising the sensing line to the half second constant voltage level, while maintaining the bias of the word line at the second constant voltage level.

Herein, the present invention can further comprise, after the data write process, a second data hold process holding the write data by biasing the word line at the negative voltage level. And, the write data may be digital logic 0 or 1.

According to the present invention, there is provided a driving circuit of an 1-transistor type DRAM comprising: a transistor storing data on a floating body; a word line controlling the transistor; a sensing line connected to a memory cell; a bit line connected to the memory cell; a sense amp sensing data on the bit line; and a register connected to the bit line.

According to the present invention, there is provided a driving method of an 1-transistor type DRAM comprising: a data hold process biasing a word line at a negative voltage level and biasing a sensing line and a bit line at a first constant voltage level; a data purging process resetting data by biasing the word line at a second constant voltage level and biasing the sensing line and the bit line at the first constant voltage level; and a data write process biasing the word line at the second constant voltage level and supplying write data to the bit line.

Herein, the present invention can further comprise, after the data write process, a second data hold process holding the write data by biasing the word line and the bottom word line at the negative voltage level. And, the write data may be digital logic 0 or 1.

According to the present invention, there is provided a driving method of an 1-transistor type DRAM comprising: a first data hold process biasing a word line at a negative voltage level and biasing a sensing line and a bit line at a first constant voltage level; a second data hold process biasing a read voltage to the bit line in the first data hold process; after the second hold process, a sensing process supplying voltage to the word line and allowing a read current to be flowed from the bit line to the sensing line; and after the sensing process, a third data hold process biasing the word line at the negative voltage level and stopping the flow of the read current.

Herein, the present invention can further comprise, after the third data hold process, a fourth data hold process biasing the bit line at the first constant voltage level.

According to the present invention, there is provided a driving method of an 1-transistor type DRAM comprising: a first process sensing and amplifying cell data for all cells in a row selected from a read cycle through a sense amp; a second process storing the sensing data in a register after the first process; a third process transmitting data stored in the register to a write driver in a write cycle after the read cycle; and a fourth process restoring data by performing a write on the cells through the write driver.

According to the present invention, there is provided a driving method of an 1-transistor type DRAM comprising: a first process sensing and amplifying cell data for all cells in a selected row through a sense amp; a second process storing the sensing data in a register after the first process; a third process transmitting data stored in the register to a write driver; and a fourth process refreshing the cell data by performing a write on the cells through the write driver.

According to the present invention, there is provided a driving circuit of an 1-transistor type DRAM comprising: a transistor storing data on a floating body; a word line controlling the transistor; a sensing line connected to the floating body of the transistor; a bit line connected to the floating body; a sense amp sensing data on the bit line to distinguish multi-level data; and a write driver connected to the sense amp and supplying a plurality of driving voltages to the sense amp.

Herein, preferably, the multi-level data are the data at different levels driven using a 4-level current. And, the plurality of driving voltages can be generated using a plurality of reference voltages.

According to the present invention, there is provided a driving method of an 1-transistor type DRAM comprising: a data hold process biasing a word line at a negative voltage level and biasing a sensing line and a bit line at a first constant voltage level; a data purging process resetting data by biasing the word line at a second constant voltage level and biasing the sensing line and the bit line at the first constant voltage level; and a data write process biasing the word line at the second constant voltage level and supplying multi-level data to the bit line using a plurality of multi-level voltages driven by a write driver.

Herein, the present invention can further comprise, after the data write process, a second data hold process holding the write data by biasing the word line at the negative voltage level.

Herein, preferably, the write data are the data with different levels driven using a 4-level current.

According to the present invention, there is provided an 1-transistor type DRAM cell comprising: a silicon substrate; a gate formed on the silicon substrate; first and second junction regions formed within the silicon substrate on both sides of the gate; an isolating layer formed to isolate between a substrate bulk within the silicon substrate below the first and second junction regions and a substrate body below the gate; a source line formed to contact the first junction region; and a bit line formed to contact the second junction region.

Herein, the first junction region can be connected to the substrate bulk.

And, a first interlayer dielectric layer can be interposed between the gate and the source line.

And, the source line can be contacted to the first junction region through a first contact plug.

And, a second interlayer dielectric layer can be interposed between the source line and the bit line.

And, the bit line can be contacted to the second junction region through a second contact plug.

According to the present invention, there is provided an 1-transistor type DRAM cell comprising: a silicon substrate; a plurality of gates formed on the silicon substrate with an equal space; a plurality of first and second junction regions formed within the silicon substrate on both sides of the gates; an isolating layer formed to isolate between a substrate bulk within the silicon substrate below the first and second junction regions and each substrate body below the gates; a plurality of source lines formed to contact the first junction regions, respectively; and a plurality of bit lines formed to contact the second junction regions.

Herein, the first junction region can be connected to the substrate bulk.

And, a first interlayer dielectric layer can be interposed between the gate and the source line.

And, the source line can be contacted to the first junction region through a first contact plug.

And, the source line including the first contact plug can be shared between the neighboring unit cells.

And, a second interlayer dielectric layer can be interposed between the source line and the bit line.

And, the bit line can be contacted to the second junction region through a second contact plug.

And, the second contact plug can be shared between the neighboring unit cells.

According to the present invention, there is provided a manufacturing method of an 1-transistor type DRAM device comprising the steps of: forming reverse-T type grooves defining T type silicon regions by etching a silicon substrate; forming an isolating layer isolating a substrate body and a substrate bulk within the reverse-T type grooves; burying silicon within a portion of the reverse-T type grooves not formed with the isolating layer; forming a gate on the T type silicon regions; forming first and second junction regions within the T type silicon region on both sides of the gate, including the silicon; forming a plurality of source lines each contacted to the first junction regions; and forming a plurality of bit lines contacted to the second junction regions.

Herein, the first and second junction regions can be formed by performing a high-concentration impurity ion implantation into the T type silicon region, including the silicon.

And, the first junction region can be formed to be connected to the substrate bulk.

And, the source line and bit line can be formed to be shared between the neighboring unit cells.

And, the step of forming the source line contacted to the first junction region can comprise the steps of: forming a first interlayer dielectric layer on the silicon substrate to cover the gates; forming a first contact hole exposing the first junction region by etching the first interlayer dielectric layer; forming a first contact plug within the first contact hole; and forming a source line on the first interlayer dielectric layer.

And, the source line including the first contact plug can be formed to be shared between the neighboring DRAM cells.

And, the step of forming the bit line contacted to the second junction region can comprise the steps of: forming a first interlayer dielectric layer on the silicon substrate to cover the gates; forming a second interlayer dielectric layer on the first interlayer dielectric layer; forming a second contact hole to expose the second junction region by etching the second and first interlayer dielectric layers; forming a second contact plug within the second contact hole; and forming a bit line on the second interlayer dielectric layer.

And, the second contact plug can be formed to be shared between the neighboring unit cells.

BRIEF DESCRIPTION OF THE DRAWINGS

FIG. 4b is a waveform view explaining the operation of FIG. 4a.

FIG. 5b is a waveform view explaining the operation of FIG. 5a.

FIG. 6b is a waveform view explaining the operation of FIG. 6a.

FIG. 10b is a waveform view explaining the operation of FIG. 10a.

FIG. 11b is a waveform view explaining the operation of FIG. 11a.

FIG. 12b is a waveform view explaining the operation of FIG. 12a.

FIG. 16b is a waveform view explaining the operation of FIG. 16a.

DESCRIPTION OF SPECIFIC EMBODIMENTS

Hereinafter, preferred embodiments of the present invention will be described in detail with reference to the accompanying drawings.

Figure 1:
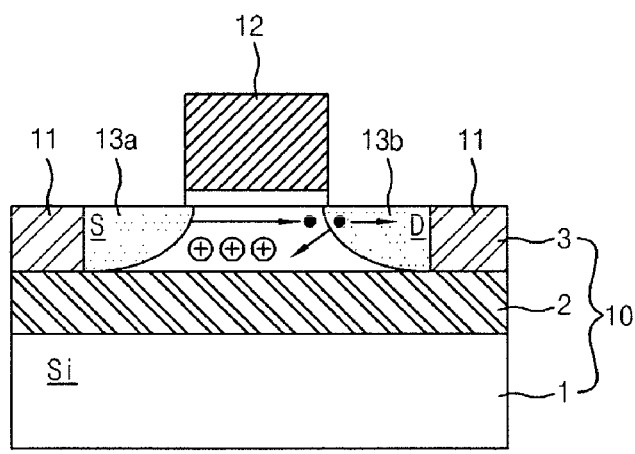
FIG. 1 is a cross-sectional view showing a DRAM cell implemented on a SOI wafer of the prior art.
Figure 2A:
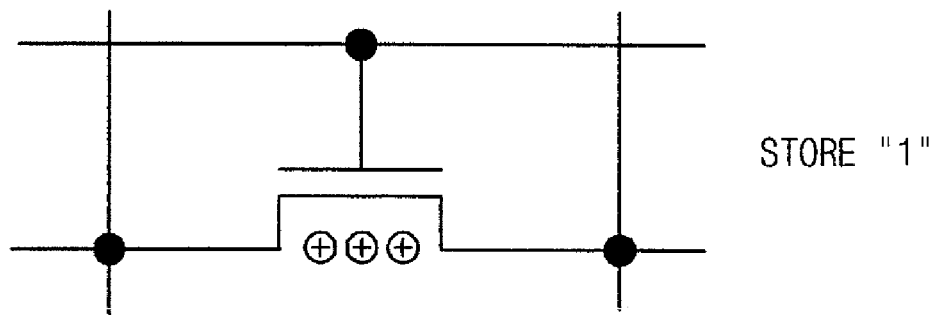
FIGS. 2a and 2b are views showing a state where cell data are stored in a DRAM cell implemented on a SOI wafer of the prior art.
Figure 2B:
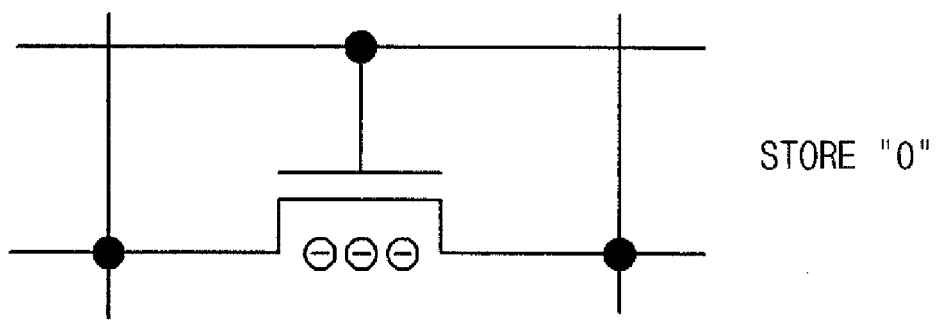
Figure 3:
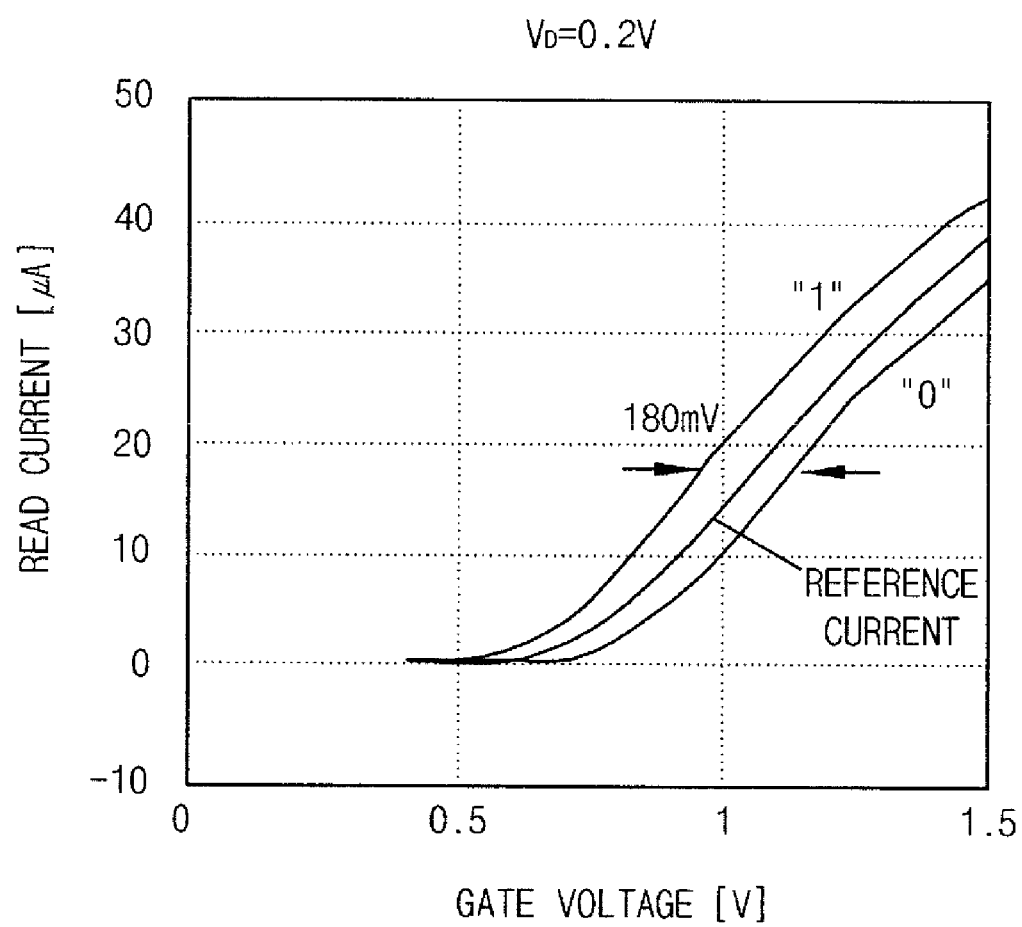
FIG. 3 is a graph showing a cell read current in a DRAM cell implemented on a SOI wafer of the prior art.
Figure 4A:
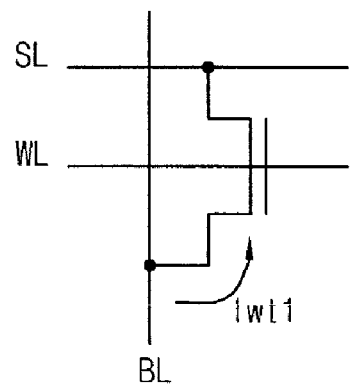
FIG. 4a is a circuit view explaining a write "1" as an embodiment of a driving method of an 1-transistor type DRAM cell according to the present invention.
Figure 4B:
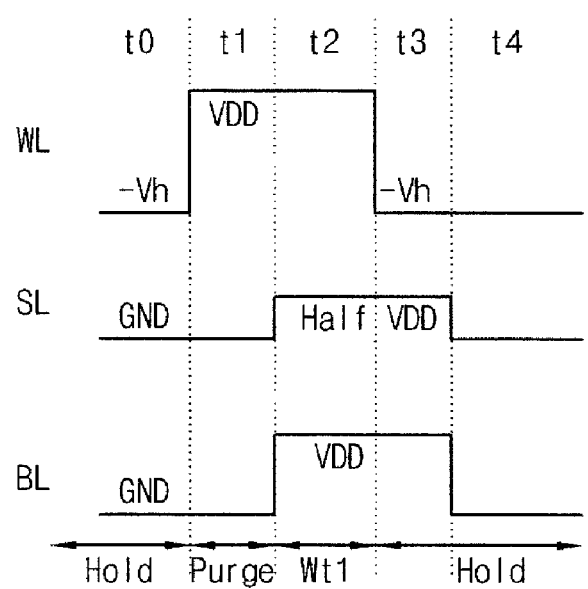

FIG. 4a is a circuit view explaining a write "1" as an embodiment of a driving method of an 1-transistor type DRAM cell according to the present invention, and FIG. 4b is a waveform view explaining the write "1" operation of FIG. 4a.

The transistor shown in FIG. 4a is a floating body type transistor implemented using bulk silicon, wherein one transistor forms a DRAM cell. A source line SL and a bit line BL are connected to the source and drain of the transistor, respectively, and a word line WL is connected to the gate thereof.

In the 1-transistor type DRAM cell of FIG. 4a, the timing for a write "1" is divided into periods of t0 to t4, wherein t0, t3, and t4 are hold periods maintaining data, t1 is a purge period resetting and initializing the data of cells, and t2 is a period performing a write "1".

First, in the t0 period, that is, in a first hold period, a ground voltage GND is maintained in the source line SL and the bit line BL, and a low voltage −Vh having lower potential than the ground voltage GND is applied to the word line WL so that the operation to maintain the data of the floating body is performed.

Thereafter, in the t1 period, that is, in the purge period, although a ground voltage GND is maintained in the source line SL and the bit line BL, the voltage of the word line WL is raised to an operating voltage VDD and accordingly, the voltage of the floating body is raised due to the coupling capacitance between the word line WL and the floating body so that the all holes of the floating body are purged into the source line SL and the bit line BL due to the voltage rising of the floating body. Therefore, the floating body is reset to be an initialization state.

Thereafter, in the t2 period, that is, in the period performing a write "1", the word line WL maintains an operation voltage VDD, the source line SL is converted into a half operation voltage Half VDD, and the bit line BL is converted into an operation voltage VDD. Therefore, the write "1" current Iwt1 flows from the bit line BL to the source line SL. At this time, a few holes occur and the holes are captured by the floating body. The voltage by means of the captured holes becomes higher than the half operation voltage and lower than the operation voltage. Therefore, the holes of high voltage are stored in the floating body.

Thereafter, in the t3 period, that is, in a second hold period, the word line WL is converted into a low voltage −Vh, the source line maintains a half operation voltage, and the bit line BL maintains an operation voltage. The word line WL is dropped into a low voltage −Vh, which is a negative hold voltage, so that the holes of high voltage stored in the floating body are in a low voltage state.

Thereafter, in the t4 period, that is, in a third hold period, the word line WL maintains a low voltage −Vh, and the source line SL and the bit line BL are converted into a ground voltage GND. Therefore, the voltage of the holes stored in the floating body is preserved in a state lower than the ground voltage GND.

Figure 5A:
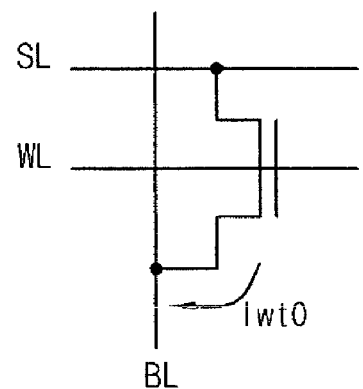
FIG. 5a is a circuit view explaining a write "0" as an embodiment of a driving method of an 1-transistor type DRAM cell according to the present invention.
Figure 5B:
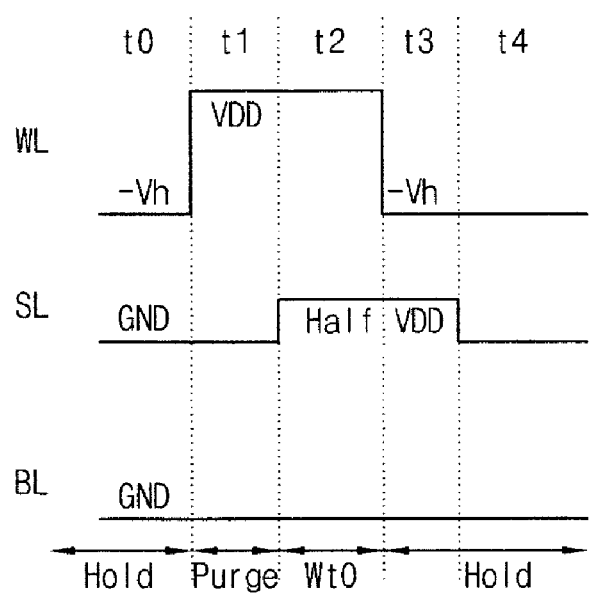

FIG. 5a is a circuit view explaining a write "0" as an embodiment of a driving method of an 1-transistor type DRAM cell as shown in FIG. 4a, and FIG. 5b is a waveform view explaining the write "1" operation of FIG. 5a.

In the 1-transistor type DRAM cell of FIG. 5a, the timing for a write "1" is divided into periods of t0 to t4, wherein t0, t3, and t4 are hold periods maintaining data, t1 is a purge period resetting and initializing the data of cells, and t2 is a period performing a write "0".

First, in the t0 period, that is, in a first hold period, a ground voltage GND is maintained in the source line SL and the bit line BL, and a low voltage −Vh having lower potential than the ground voltage GND is applied to the word line WL so that the operation to maintain the data of the floating body is performed.

Thereafter, in the t1 period, that is, in the purge period, although a ground voltage GND is maintained in the source line SL and the bit line BL, the voltage of the word line WL is raised to an operating voltage VDD and accordingly, the voltage of the floating body is raised due to the coupling capacitance between the word line WL and the floating body so that the all holes of the floating body are purged into the source line SL and the bit line BL due to the voltage rising of the floating body. Therefore, the floating body is reset to be an initialization state.

Thereafter, in the t2 period, that is, in the period performing a write "0", the word line WL maintains an operation voltage VDD, the source line SL is converted into a half operation voltage Half VDD, and the bit line BL is converted into an operation voltage VDD. Therefore, the write "0" current Iwt0 flows from the source line SL to the bit line BL. That is, the current flows in a reverse direction of the write "1" current Iwt1. At this time, few holes occur and the holes are captured by the floating body. The voltage by means of the captured holes becomes higher than the ground voltage and lower than the half operation voltage. Therefore, the holes of low voltage are stored in the floating body.

Thereafter, in the t3 period, the word line WL is converted into a low voltage −Vh, the source line maintains a half operation voltage, and the bit line BL maintains a ground voltage. The word line WL is dropped into a low voltage −Vh, which is a negative hold voltage, so that the holes of high voltage stored in the floating body are in an extra low voltage state.

Thereafter, in the t4 period, the word line WL maintains a low voltage −Vh, the source line SL is converted into a ground voltage GND, and the bit line BL maintains a ground voltage GND. Therefore, the voltage of the holes stored in the floating body is preserved in a state lower than the ground voltage GND.

Figure 6A:
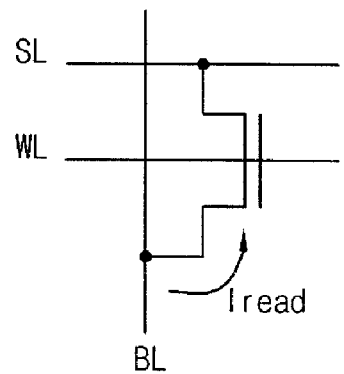
FIG. 6a is a circuit view explaining a read method as an embodiment of a driving method of an 1-transistor type DRAM cell according to the present invention.
Figure 6B:
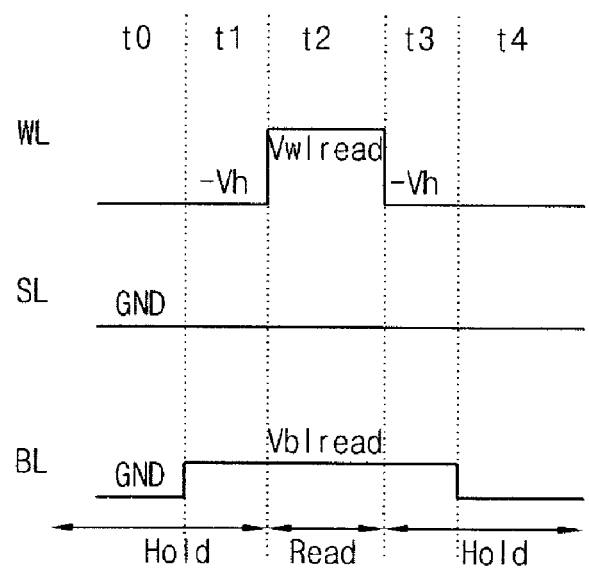

FIG. 6a is a circuit view explaining a read method as an embodiment of a driving method of an 1-transistor type DRAM cell as shown in FIGS. 4a and 5a, and FIG. 6b is a waveform view explaining the read method of FIG. 6a.

In the 1-transistor type DRAM cell of FIG. 6a, the timing for a read is divided into periods of t0 to t4, wherein t0, t1, t3, and t4 are hold periods maintaining data, and t2 is a period performing a read.

First, in the t0 period, that is, in a first hold period, a ground voltage GND is maintained in the source line SL and the bit line BL, and a low voltage −Vh having lower potential than the ground voltage GND is applied to the word line WL so that the operation to maintain the data of the floating body is performed.

Thereafter, in the t1 period applying a bit line read voltage in order to sense a cell read current, a bit line read voltage Vblread is applied to the bit line BL.

Thereafter, in the t2 period applying a word line read voltage, if a word line read voltage Vwlread is applied to the word line WL, a read current Iread flows from the bit line BL to the word line source line SL. At this time, if the amount of the flowed sensing current is larger than the reference current, data becomes 1 and if it smaller than the reference current, data becomes 0.

Thereafter, in the t3 period, if the voltage applied to the word line WL is returned to a low voltage −Vh, the flow of the read current Iread is stopped.

Thereafter, in the t4 period, the voltage applied to the bit line BL is returned to a ground voltage GND and accordingly, the voltage of the holes stored in the floating body is preserved in a state lower than the ground voltage GND.

As described above, with the embodiment according to the present invention, the write "1", the write "0", and the read operations of the 1-transistor type DRAM cell can be performed.

Figure 7:
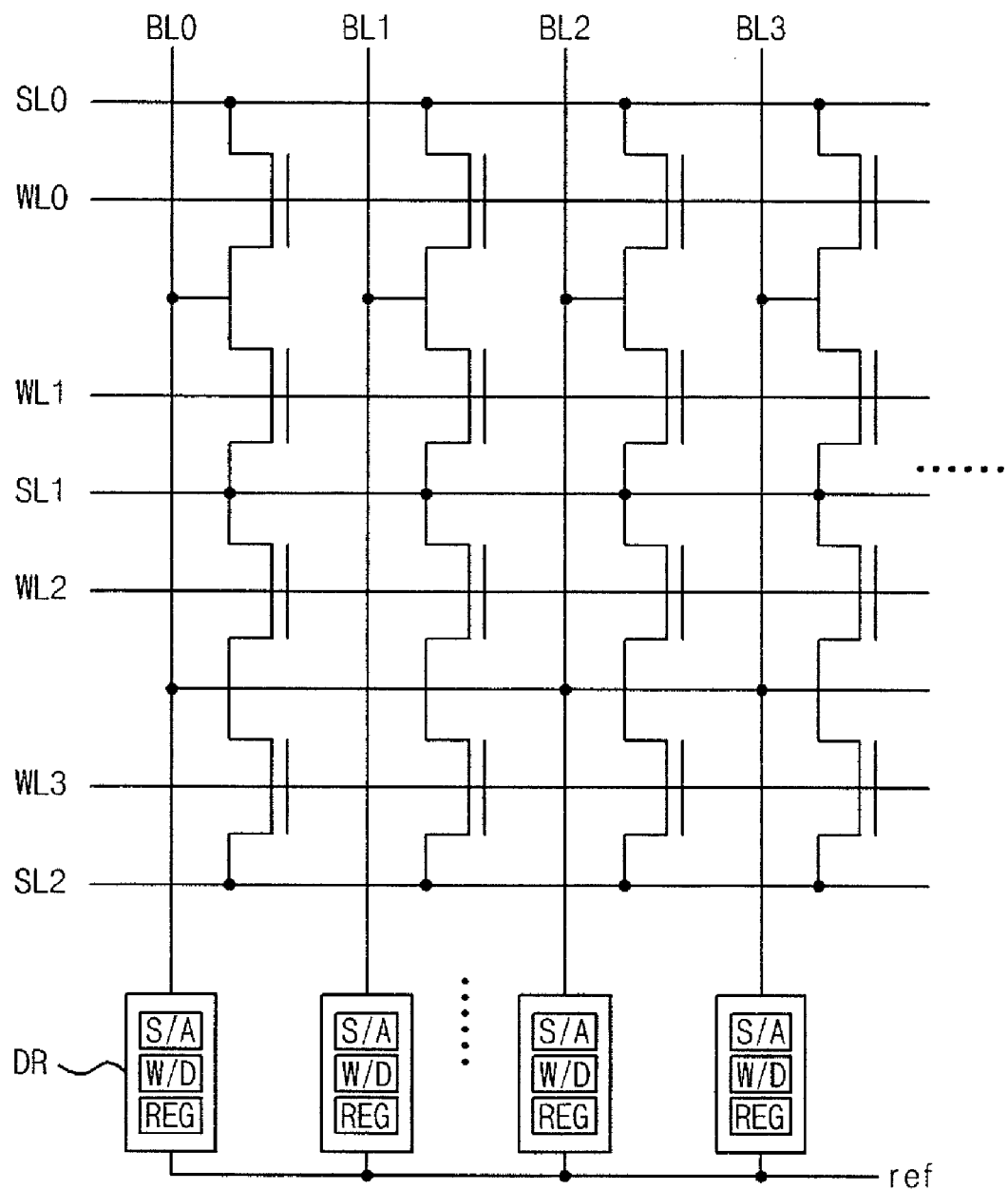
FIG. 7 is a circuit view showing an embodiment of an 1-transistor type DRAM according to the present invention.

FIG. 7 is a circuit view showing a cell array according to the present invention, wherein each cell forming the cell array is an 1-transistor type cell of a floating body type using bulk silicon.

The cell array of FIG. 7 has a structure where the respective two cells share the bit line contacts, and the cells sharing the same word lines share the same source lines.

In other words, the word lines WL and the source lines SL are arranged in a row direction to be interlaced, and the bit lines BL are arranged in a column direction. The respective bit lines BL constituted by a sense amp S/A, a word line driver W/D, and a register block REG, is supplied with a reference voltage, wherein preferably, the sense amp S/A and the word line driver W/D have a constitution to share the register block REG.

Herein, the sense amp S/A is a circuit operated for distinguishing data 1 from data 0 by sensing cell data, the register block REG is a temporary memory circuit temporarily storing the data of the sense amp S/A, and the word line driver W/D is a circuit generating other driving voltage in the bit lines BL according to the write data when writing data in the cell.

Figure 8:
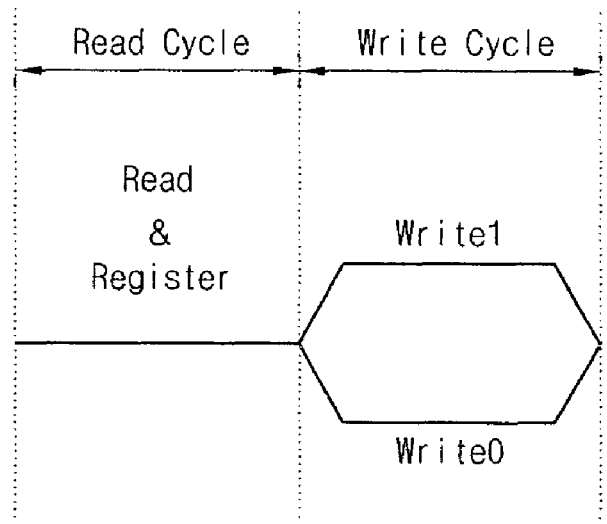
FIG. 8 is a waveform view explaining a write method using a cell array of the 1-transistor type DRAM of FIG. 7.

The write method according to the constitution of the cell array as described above will be described with reference to FIG. 8.

The write includes a read cycle and a write cycle.

First, cell data are sensed and amplified for all the cells corresponding to the row selected from the read cycle and then, are stored in the register block REG. Thereafter, the data stored in the resister block REG are written back to be restored in the write cycle, and cells to be newly written are written with new external data. At this time, the new external data can be written in the cell by being cleared and reset in the register block REG.

Figure 9:
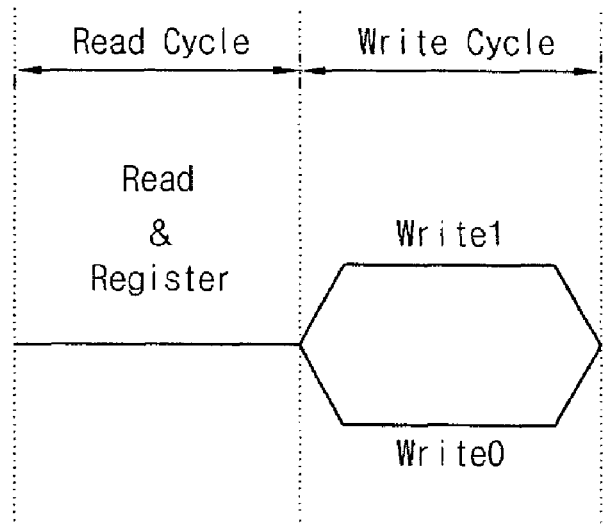
FIG. 9 is a waveform view explaining a refresh method using a cell array of the 1-transistor type DRAM of FIG. 7.

Meanwhile, a refresh method according to the constitution of the cell array as described above will be described with reference to FIG. 9.

The refresh includes a read cycle and a write cycle, cell data are sensed and amplified for all the cells corresponding to the row selected from the read cycle and then, are stored in the register block REG. Thereafter, the data stored in the resister block REG are written back.

Meanwhile, the 1-transistor type DRAM cell according to the present invention can be differently driven as shown in FIGS. 10a to 12b.

Figure 10A:
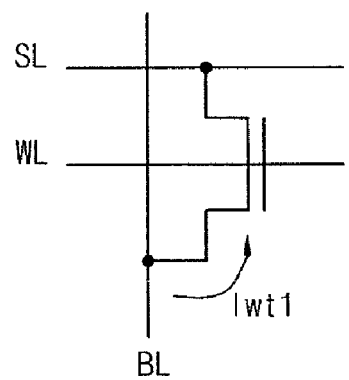
FIG. 10a is a circuit view explaining a write "1" as another embodiment of a driving method of an 1-transistor type DRAM cell according to the present invention.
Figure 10B:
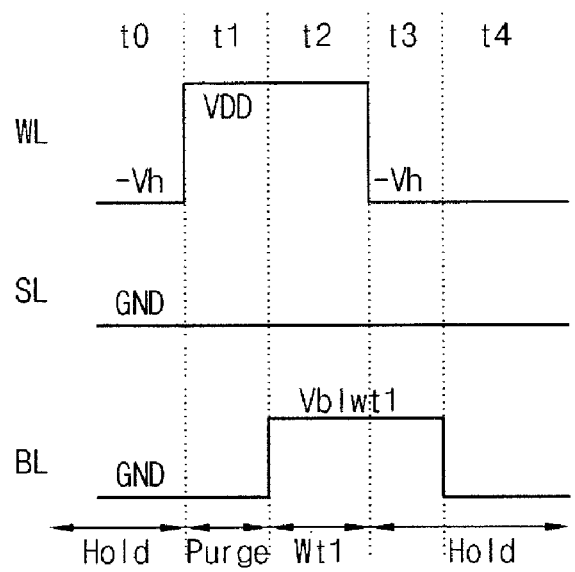

FIG. 10a is a circuit view explaining a write "1" as another embodiment of a driving method of an 1-transistor type DRAM cell according to the present invention, and FIG. 10b is a waveform view explaining a write "1" operation of FIG. 10a.

The transistor shown in FIG. 10a is a floating body type transistor implemented using bulk silicon, wherein one transistor forms a DRAM cell. A source line SL and a bit line BL are connected to the source and drain of the transistor, respectively, and a word line WL is connected to the gate thereof.

In the 1-transistor type DRAM cell of FIG. 10a, the timing for a write "1" is divided into periods of t0 to t4, wherein t0, t3, and t4 are hold periods maintaining data, t1 is a purge period resetting and initializing the data of cells, and t2 is a period performing a write "1".

First, in the t0 period, that is, in a first hold period, a ground voltage GND is maintained in the source line SL and the bit line BL, and a low voltage −Vh having lower potential than the ground voltage GND is applied to the word line WL so that the operation to maintain the data of the floating body is performed.

Thereafter, in the t1 period, that is, in the purge period, although a ground voltage GND is maintained in the source line SL and the bit line BL, the voltage of the word line WL is raised to an operating voltage VDD and accordingly, the voltage of the floating body is raised due to the coupling capacitance between the word line WL and the floating body so that the all holes of the floating body are purged into the source line SL and the bit line BL due to the voltage rising of the floating body. Therefore, the floating body is reset to be an initialization state.

Thereafter, in the t2 period, that is, in the period performing a write "1", the word line WL maintains an operation voltage VDD, the source line SL maintains a ground voltage GND, and the bit line BL is converted into a bit line write voltage Vblwt1. Therefore, the write "1" current Iwt1 flows from the bit line BL to the source line SL. At this time, a few holes occur and the holes are captured by the floating body. The voltage by means of the captured holes becomes lower than the bit line write voltage Vblwt1. Therefore, the holes of high voltage are stored in the floating body.

Thereafter, in the t3 period, that is, in a second hold period, the word line WL is converted into a low voltage −Vh, the source line maintains a ground voltage GND, and the bit line BL maintains a bit line write voltage Vblwt1. The word line WL is dropped into a low voltage −Vh, which is a negative hold voltage, so that the holes of high voltage stored in the floating body are in a low voltage state.

Thereafter, in the t4 period, that is, in a third hold period, the word line WL maintains a low voltage −Vh, and the source line SL and the bit line BL are converted into a ground voltage GND. Therefore, the voltage of the holes stored in the floating body is preserved in a state lower than the ground voltage GND.

Figure 11A:
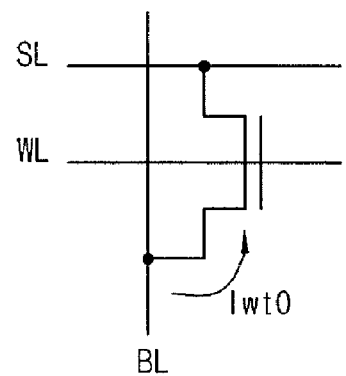
FIG. 11a is a circuit view explaining a write "0" as another embodiment of a driving method of an 1-transistor type DRAM cell according to the present invention.
Figure 11B:
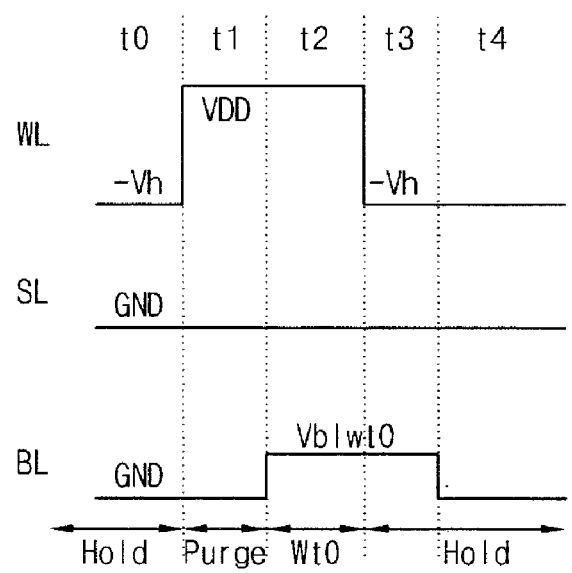

FIG. 11a is a circuit view explaining a write "0" as another embodiment of a driving method of an 1-transistor type DRAM cell as shown in FIG. 4a, and FIG. 11b is a waveform view explaining a write "1" operation of FIG. 11a.

In the 1-transistor type DRAM cell of FIG. 11a, the timing for a write "1" is divided into periods of t0 to t4, wherein t0, t3, and t4 are hold periods maintaining data, t1 is a purge period resetting and initializing the data of cells, and t2 is a period performing a write "0".

First, in the t0 period, that is, in a first hold period, a ground voltage GND is maintained in the source line SL and the bit line BL, and a low voltage −Vh having lower potential than the ground voltage GND is applied to the word line WL so that the operation to maintain the data of the floating body is performed.

Thereafter, in the t1 period, that is, in the purge period, although a ground voltage GND is maintained in the source line SL and the bit line BL, the voltage of the word line WL is raised to an operating voltage VDD and accordingly, the voltage of the floating body is raised due to the coupling capacitance between the word line WL and the floating body so that the all holes of the floating body are purged into the source line SL and the bit line BL due to the voltage rising of the floating body. Therefore, the floating body is reset to be an initialization state.

Thereafter, in the t2 period, that is, in the period performing a write "0", the word line WL maintains an operation voltage VDD, the source line SL maintains a ground voltage GND, and the bit line BL is converted into a bit line write voltage Vblwt0. Therefore, the write "0" current Iwt0 flows from the bit line BL to the source line SL. That is, At this time, since the bit line write voltage Vblwt0 is smaller than a bit line write voltage Vblwt1, few holes occur and the holes are captured by the floating body. The voltage by means of the captured holes becomes lower than the bit line write voltage Vblwt0. Therefore, the holes of low voltage are stored in the floating body.

Thereafter, in the t3 period, the word line WL is converted into a low voltage −Vh, the source line maintains a ground voltage GND, and the bit line BL maintains a bit line write voltage Vblwt0. The word line WL is dropped into a low voltage −Vh, which is a negative hold voltage, so that the holes of high voltage stored in the floating body are in an extra low voltage state.

Thereafter, in the t4 period, the word line WL maintains a low voltage −Vh, the source line SL maintains a ground voltage GND, and the bit line BL is converted into a ground voltage GND. Therefore, the voltage of the holes stored in the floating body is preserved in a state lower than the ground voltage GND.

Figure 12A:
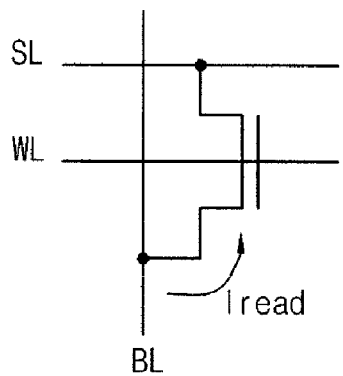
FIG. 12a is a circuit view explaining a read method as another embodiment of a driving method of an 1-transistor type DRAM cell according to the present invention.
Figure 12B:
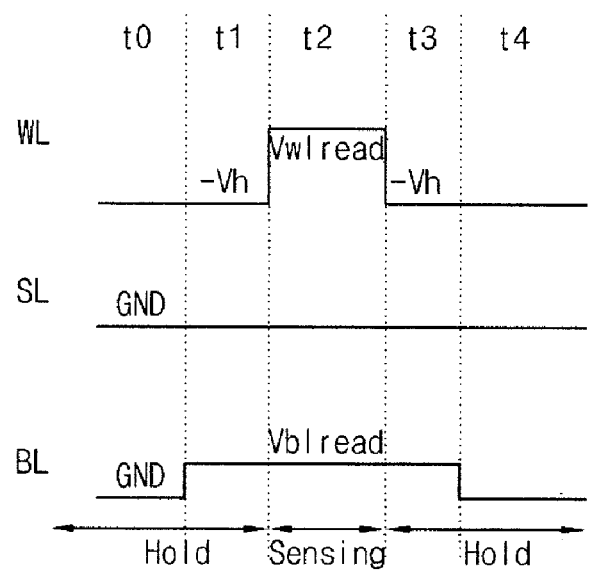

FIG. 12a is a circuit view explaining a read method as an embodiment of a driving method of an 1-transistor type DRAM cell as shown in FIGS. 10a and 11a, and FIG. 12b is a waveform view explaining the read method of FIG. 12a.

In the 1-transistor type DRAM cell of FIG. 12a, the timing for a read is divided into periods of t0 to t4, wherein t0, t1, t3, and t4 are hold periods maintaining data, and t2 is a period performing a read.

First, in the t0 period, that is, in a first hold period, a ground voltage GND is maintained in the source line SL and the bit line BL, and a low voltage −Vh having lower potential than the ground voltage GND is applied to the word line WL so that the operation to maintain the data of the floating body is performed.

Thereafter, in the t1 period applying a bit line read voltage in order to sense a cell read current, a bit line read voltage Vblread is applied to the bit line BL.

Thereafter, in the t2 period applying a word line read voltage, if a word line read voltage Vwlread is applied to the word line WL, a read current Iread flows from the bit line BL to the word line source line SL. At this time, if the amount of the flowed sensing current is larger than the reference current, data becomes 1 and if it smaller than the reference current, data becomes 0.

Thereafter, in the t3 period, if the voltage applied to the word line WL is returned to a low voltage −Vh, the flow of the read current Iread is stopped.

Thereafter, in the t4 period, the voltage applied to the bit line BL is returned to a ground voltage GND and accordingly, the voltage of the holes stored in the floating body is preserved in a state lower than the ground voltage GND.

As described above, with the embodiment according to the present invention, the write "1", the write "0", and the read operations of the 1-transistor type DRAM cell can be performed.

Figure 13:
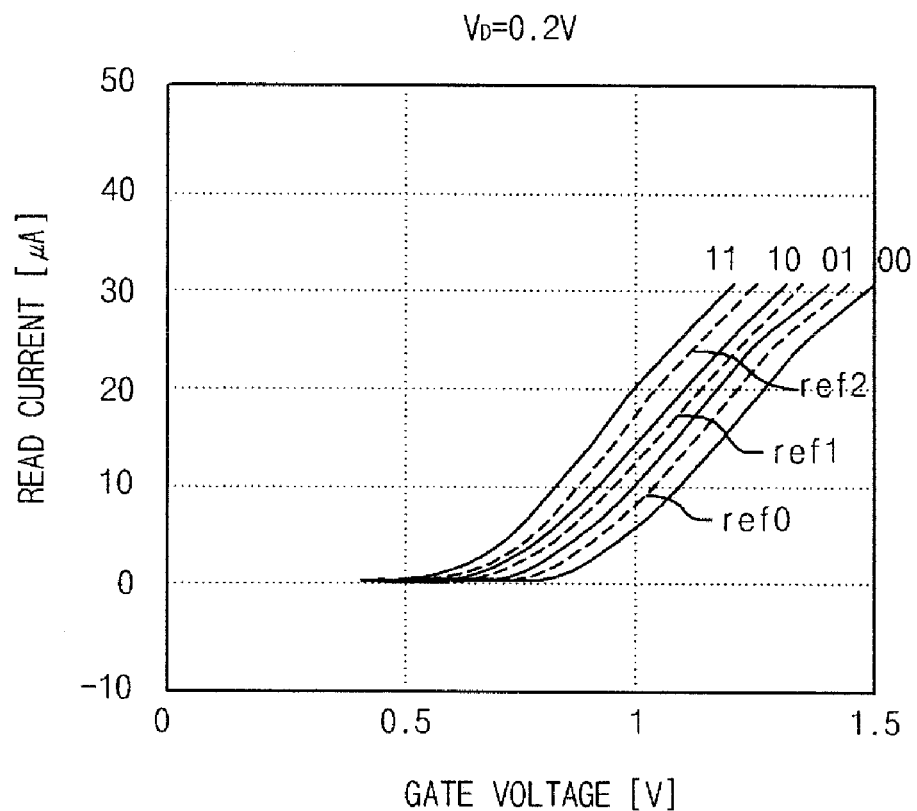
FIG. 13 is a graph explaining a multi-level drive as another embodiment according to the present invention.

FIG. 13 is a graph showing a 4-level 2-bit cell read current implemented in the present invention. It is a graph showing a cell read current when a cell drain voltage Vd is 0.2V, a cell source voltage is ground GND and a cell gate voltage is swept, for a DRAM cell implemented on a SOI wafer of the prior art, wherein the highest level is data 11, the next lower level is data 10, the next lower level is data 01, and the lowest level is 00, and the respective reference voltages REF0, REF1, and REF2 are positioned between each level so that a multiplex bit can be recognized.

A method writing the 4-level data will be described in detail with reference to FIGS. 14 and 15a to 15d.

Figure 14:
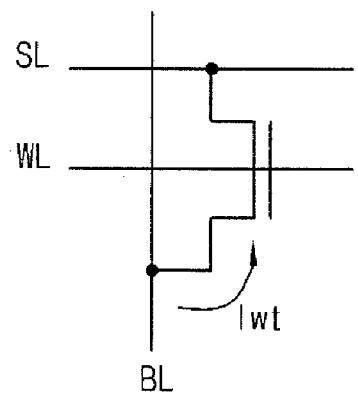
FIG. 14 is a circuit view explaining a write "1" as another embodiment of a driving method of an 1-transistor type DRAM cell according to the present invention.

FIG. 14 is a circuit view explaining a write of the 4-level data as an embodiment of a driving method of an 1-transistor type DRAM cell according to the present invention.

The transistor shown in FIG. 14 is a floating body type transistor implemented using bulk silicon, wherein one transistor forms a DRAM cell. A source line SL and a bit line BL are connected to the source and drain of the transistor, respectively, and a word line WL is connected to the gate thereof. In order to implement the 4-level, a bit line write voltage gradually decreasing from data 11 to data 00 is applied to the bit line BL, as shown in FIGS. 15a to 15d.

The operation to implement a write 11 will be described with reference to FIG. 15a.

Figure 15A:
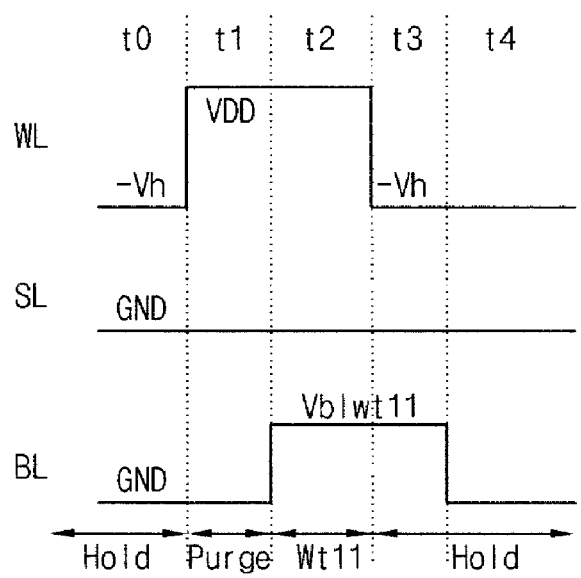
FIG. 15a-15d are waveform views explaining the operation of FIG. 14.

In the 1-transistor type DRAM cell of FIG. 14, the timing for a write "11" is divided into periods of t0 to t4, as shown in FIG. 15a, wherein t0, t3, and t4 are hold periods maintaining data, t1 is a purge period resetting and initializing the data of cells, and t2 is a period performing a write "11".

First, in the t0 period, that is, in a first hold period, a ground voltage GND is maintained in the source line SL and the bit line BL, and a low voltage −Vh having lower potential than the ground voltage GND is applied to the word line WL so that the operation to maintain the data of the floating body is performed.

Thereafter, in the t1 period, that is, in the purge period, although a ground voltage GND is maintained in the source line SL and the bit line BL, the voltage of the word line WL is raised to an operating voltage VDD and accordingly, the voltage of the floating body is raised due to the coupling capacitance between the word line WL and the floating body so that the all holes of the floating body are purged into the source line SL and the bit line BL due to the voltage rising of the floating body. Therefore, the floating body is reset to be an initialization state.

Thereafter, in the t2 period, that is, in the period performing a write "11", the word line WL maintains an operation voltage VDD, the source line SL maintains a ground voltage GND, and the bit line BL is converted into a bit line write voltage Vblwt11. Therefore, the write current Iwt flows from the bit line BL to the source line SL, having the amount corresponding to the bit line write voltage Vblwt11. At this time, holes having the amount corresponding to the data 11 occur and the holes are captured by the floating body. The voltage by means of the captured holes becomes lower than the bit line write voltage Vblwt11. Therefore, the holes of high voltage are stored in the floating body.

Thereafter, in the t3 period, that is, in a second hold period, the word line WL is converted into a low voltage −Vh, the source line maintains a ground voltage GND, and the bit line BL maintains a bit line write voltage Vblwt11. The word line WL is dropped into a low voltage −Vh, which is a negative hold voltage, so that the holes of high voltage stored in the floating body are in a low voltage state.

Thereafter, in the t4 period, that is, in a third hold period, the word line WL maintains a low voltage −Vh, and the source line SL and the bit line BL are converted into a ground voltage GND. Therefore, the voltage of the holes stored in the floating body is preserved in a state lower than the ground voltage GND.

The operation to implement a write 10 will be described with reference to FIG. 15b.

Figure 15B:
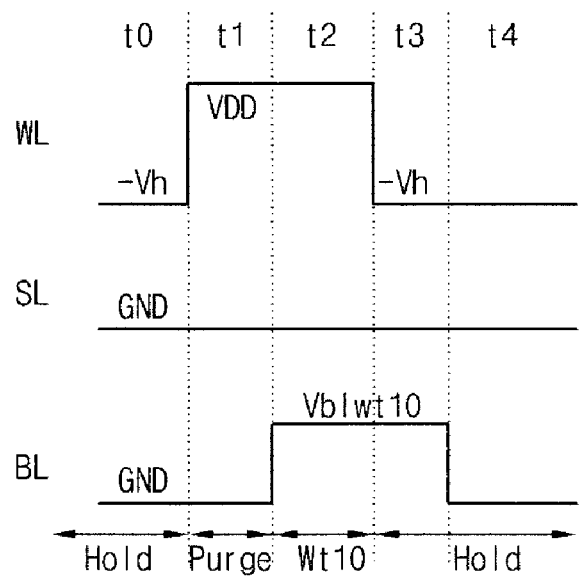

In the 1-transistor type DRAM cell of FIG. 14, the timing for a write "10" is divided into periods of t0 to t4, as shown in FIG. 15b, wherein t0, t3, and t4 are hold periods maintaining data, t1 is a purge period resetting and initializing the data of cells, and t2 is a period performing a write "10".

First, in the t0 period, that is, in a first hold period, a ground voltage GND is maintained in the source line SL and the bit line BL, and a low voltage −Vh having lower potential than the ground voltage GND is applied to the word line WL so that the operation to maintain the data of the floating body is performed.

Thereafter, in the t1 period, that is, in the purge period, although a ground voltage GND is maintained in the source line SL and the bit line BL, the voltage of the word line WL is raised to an operating voltage VDD and accordingly, the voltage of the floating body is raised due to the coupling capacitance between the word line WL and the floating body so that the all holes of the floating body are purged into the source line SL and the bit line BL due to the voltage rising of the floating body. Therefore, the floating body is reset to be an initialization state.

Thereafter, in the t2 period, that is, in the period performing a write "10", the word line WL maintains an operation voltage VDD, the source line SL maintains a ground voltage GND, and the bit line BL is converted into a bit line write voltage Vblwt10. Therefore, the write current Iwt flows from the bit line BL to the source line SL, having the amount corresponding to the bit line write voltage Vblwt10. At this time, holes having the amount corresponding to the data 10 occur and the holes are captured by the floating body. The voltage by means of the captured holes becomes lower than the bit line write voltage Vblwt10. Therefore, the holes of high voltage are stored in the floating body.

Thereafter, in the t3 period, that is, in a second hold period, the word line WL is converted into a low voltage −Vh, the source line maintains a ground voltage GND, and the bit line BL maintains a bit line write voltage Vblwt10. The word line WL is dropped into a low voltage −Vh, which is a negative hold voltage, so that the holes of high voltage stored in the floating body are in a low voltage state.

Thereafter, in the t4 period, that is, in a third hold period, the word line WL maintains a low voltage −Vh, and the source line SL and the bit line BL are converted into a ground voltage GND. Therefore, the voltage of the holes stored in the floating body is preserved in a state lower than the ground voltage GND.

The operation to implement a write 01 will be described with reference to FIG. 15c.

Figure 15C:
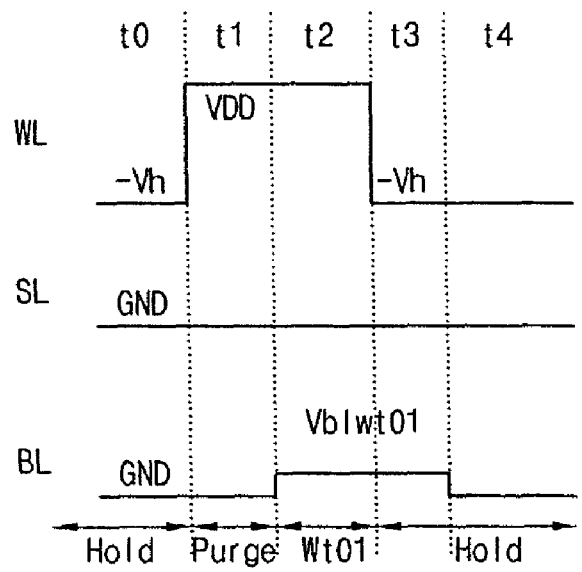

In the 1-transistor type DRAM cell of FIG. 14, the timing for a write "01" is divided into periods of t0 to t4, as shown in FIG. 15c, wherein t0, t3, and t4 are hold periods maintaining data, t1 is a purge period resetting and initializing the data of cells, and t2 is a period performing a write "01".

First, in the t0 period, that is, in a first hold period, a ground voltage GND is maintained in the source line SL and the bit line BL, and a low voltage −Vh having lower potential than the ground voltage GND is applied to the word line WL so that the operation to maintain the data of the floating body is performed.

Thereafter, in the t1 period, that is, in the purge period, although a ground voltage GND is maintained in the source line SL and the bit line BL, the voltage of the word line WL is raised to an operating voltage VDD and accordingly, the voltage of the floating body is raised due to the coupling capacitance between the word line WL and the floating body so that the all holes of the floating body are purged into the source line SL and the bit line BL due to the voltage rising of the floating body. Therefore, the floating body is reset to be an initialization state.

Thereafter, in the t2 period, that is, in the period performing a write "01", the word line WL maintains an operation voltage VDD, the source line SL maintains a ground voltage GND, and the bit line BL is converted into a bit line write voltage Vblwt01. Therefore, the write current Iwt flows from the bit line BL to the source line SL, having the amount corresponding to the bit line write voltage Vblwt01. At this time, holes having the amount corresponding to the data 01 occur and the holes are captured by the floating body. The voltage by means of the captured holes becomes lower than the bit line write voltage Vblwt01. Therefore, the holes of high voltage are stored in the floating body.

Thereafter, in the t3 period, that is, in a second hold period, the word line WL is converted into a low voltage −Vh, the source line maintains a ground voltage GND, and the bit line BL maintains a bit line write voltage Vblwt01. The word line WL is dropped into a low voltage −Vh, which is a negative hold voltage, so that the holes of high voltage stored in the floating body are in a low voltage state.

Thereafter, in the t4 period, that is, in a third hold period, the word line WL maintains a low voltage −Vh, and the source line SL and the bit line BL are converted into a ground voltage GND. Therefore, the voltage of the holes stored in the floating body is preserved in a state lower than the ground voltage GND.

The operation to implement a write 00 will be described with reference to FIG. 15d.

Figure 15D:
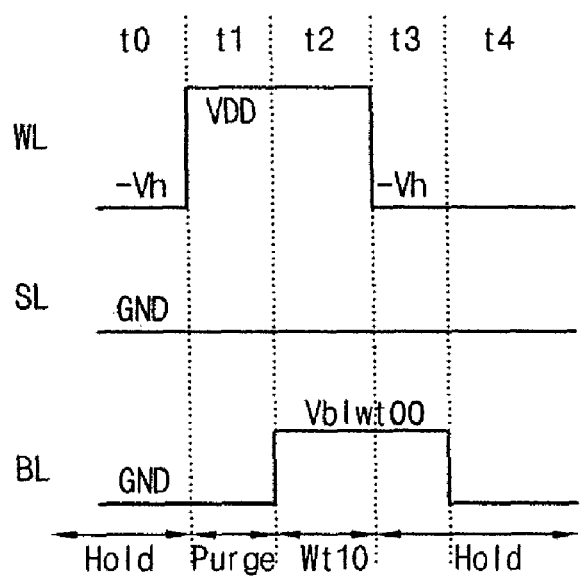

In the 1-transistor type DRAM cell of FIG. 14, the timing for a write "00" is divided into periods of t0 to t4, as shown in FIG. 15d, wherein t0, t3, and t4 are hold periods maintaining data, t1 is a purge period resetting and initializing the data of cells, and t2 is a period performing a write "00".

First, in the t0 period, that is, in a first hold period, a ground voltage GND is maintained in the source line SL and the bit line BL, and a low voltage −Vh having lower potential than the ground voltage GND is applied to the word line WL so that the operation to maintain the data of the floating body is performed.

Thereafter, in the t1 period, that is, in the purge period, although a ground voltage GND is maintained in the source line SL and the bit line BL, the voltage of the word line WL is raised to an operating voltage VDD and accordingly, the voltage of the floating body is raised due to the coupling capacitance between the word line WL and the floating body so that the all holes of the floating body are purged into the source line SL and the bit line BL due to the voltage rising of the floating body. Therefore, the floating body is reset to be an initialization state.

Thereafter, in the t2 period, that is, in the period performing a write "00", the word line WL maintains an operation voltage VDD, the source line SL maintains a ground voltage GND, and the bit line BL is converted into a bit line write voltage Vblwt00. Therefore, the write current Iwt flows from the bit line BL to the source line SL, having the amount corresponding to the bit line write voltage Vblwt00. At this time, holes having the amount corresponding to the data 00 occur and the holes are captured by the floating body. The voltage by means of the captured holes becomes lower than the bit line write voltage Vblwt00. Therefore, the holes of high voltage are stored in the floating body.

Thereafter, in the t3 period, that is, in a second hold period, the word line WL is converted into a low voltage −Vh, the source line maintains a ground voltage GND, and the bit line BL maintains a bit line write voltage Vblwt00. The word line WL is dropped into a low voltage −Vh, which is a negative hold voltage, so that the holes of high voltage stored in the floating body are in a low voltage state.

Thereafter, in the t4 period, that is, in a third hold period, the word line WL maintains a low voltage −Vh, and the source line SL and the bit line BL are converted into a ground voltage GND. Therefore, the voltage of the holes stored in the floating body is preserved in a state lower than the ground voltage GND.

Figure 16A:
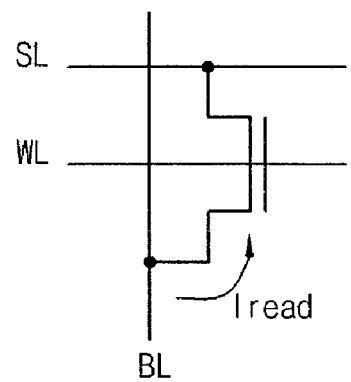
FIG. 16a is a circuit view explaining a read method as another embodiment of a driving method of an 1-transistor type DRAM cell according to the present invention.
Figure 16B:
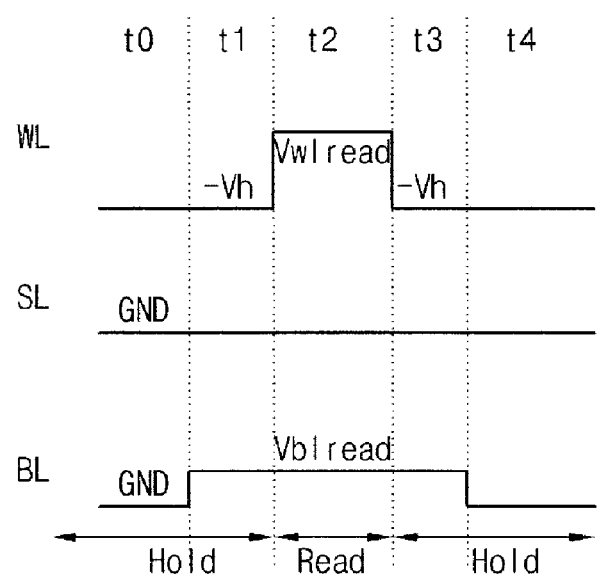

FIG. 16a is a circuit view explaining a read method as an embodiment of a driving method of an 1-transistor type DRAM cell as shown in FIG. 14, and FIG. 16b is a waveform view explaining the read method of FIG. 16a.

In the 1-transistor type DRAM cell of FIG. 16a, the timing for a read is divided into periods of t0 to t4, wherein t0, t1, t3, and t4 are hold periods maintaining data, and t2 is a period performing a read.

First, in the t0 period, that is, in a first hold period, a ground voltage GND is maintained in the source line SL and the bit line BL, and a low voltage −Vh having lower potential than the ground voltage GND is applied to the word line WL so that the operation to maintain the data of the floating body is performed.

Thereafter, in the t1 period applying a bit line read voltage in order to sense a cell read current, a bit line read voltage Vblread is applied to the bit line BL.

Thereafter, in the t2 period applying a word line read voltage, if a word line read voltage Vwlread is applied to the word line WL, a read current Iread flows from the bit line BL to the word line source line SL. At this time, if the amount of the flowed sensing current is larger than the reference current, data becomes 1 and if it smaller than the reference current, data becomes 0.

Thereafter, in the t3 period, if the voltage applied to the word line WL is returned to a low voltage −Vh, the flow of the read current Iread is stopped.

Thereafter, in the t4 period, the voltage applied to the bit line BL is returned to a ground voltage GND and accordingly, the voltage of the holes stored in the floating body is preserved in a state lower than the ground voltage GND.

As described above, with the embodiment according to the present invention, the write "1", the write "0", and the read operations of the 1-transistor type DRAM cell can be performed.

Figure 17:
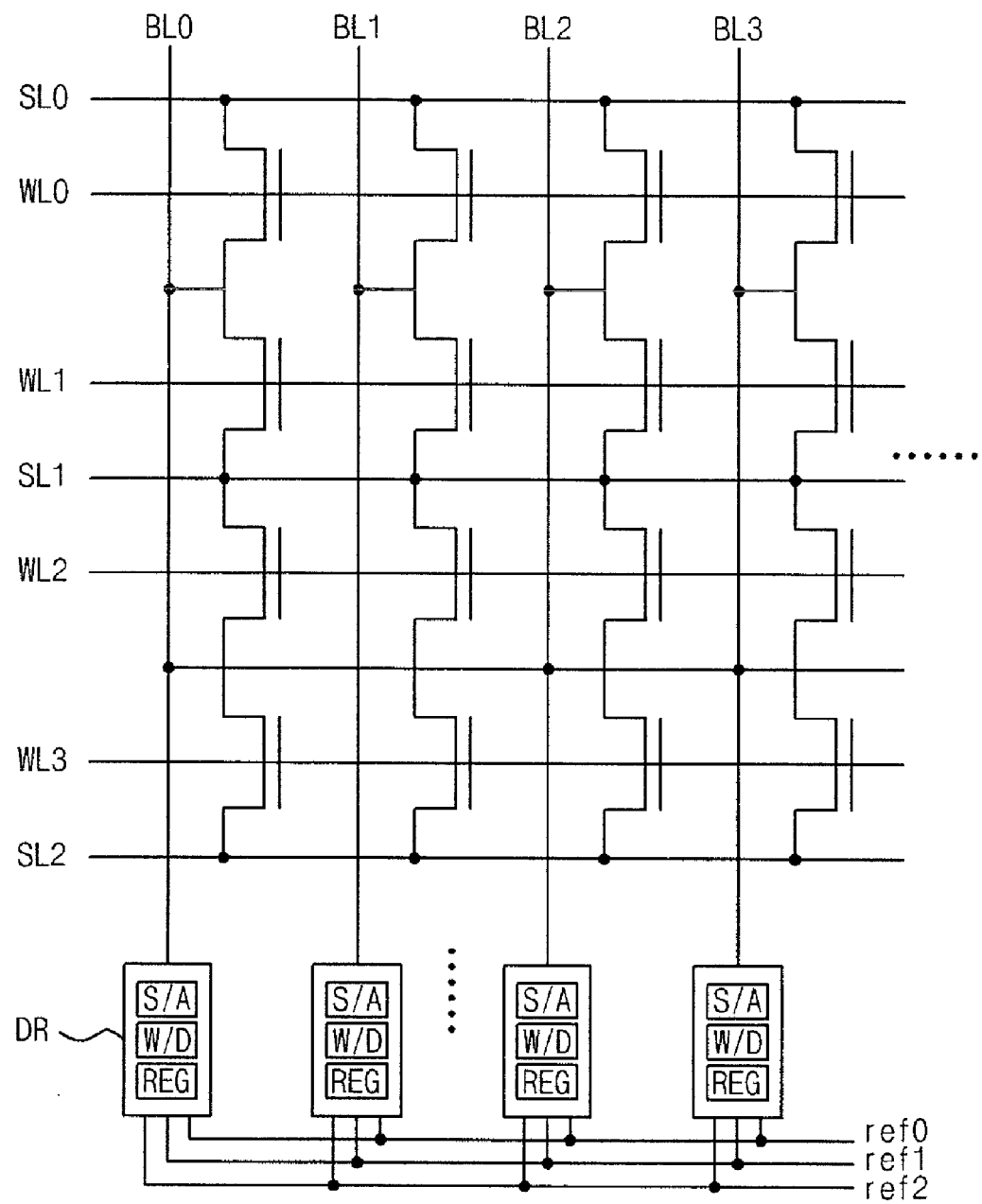
FIG. 17 is a view showing the 1-transistor type DRAM array structure for the multi bit of FIG. 14.

FIG. 17 is a circuit diagram showing a single gate cell array structure driving a multi-level according to the present invention. As shown, the respective two cells have the structure sharing the bit line contacts and the sensing line contacts. And, the word lines WL0, ... , WL3, and the sensing line SL0, ... , SL2 are arranged in a row direction and the bit lines BL0, ... , BL3 are arranged in a column direction. And, the respective bit lines BL0, ... , BL 3 are constituted by a sense amp S/A, a write driver W/D, and a register block REG and each of these circuits is supplied with a reference voltage ref0, ref1, and ref2.

In FIG. 17, the sense amp S/A is operated as a circuit for distinguishing the data 11, 10, 01, 00 by sensing the cell data. And, the register block REG is a temporary memory circuit temporarily storing the data of the sense amp S/A. And, the write driver W/D is a circuit generating the driving voltages Write 11, Write 10, Write 01, Write 00 in the bit lines BL according to the write data when writing data in the cell.

Figure 18:
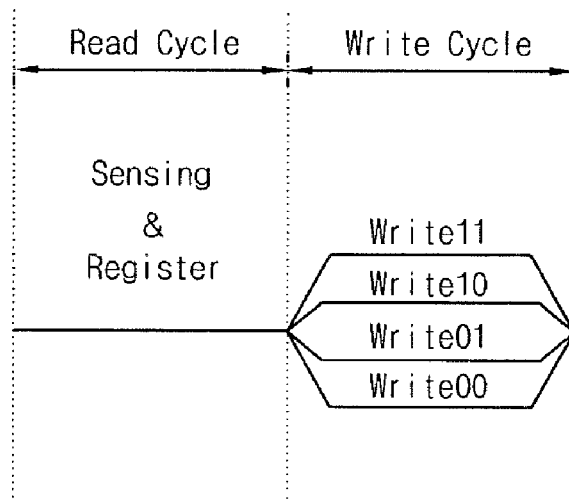
FIG. 18 is a view showing an example of a write cycle for the multi bit of FIG. 14.

FIG. 18 shows one example of a write process of the 1-transistor type DRAM according to the present invention.

As shown, the write process includes a read cycle and a write cycle. In the read cycle period, cell data are sensed and amplified for all the cells in a row selected and then, are stored in the register. And, in the write cycle, the data stored in the resister are back written to be restored. Meanwhile, cells to be newly written are written with new external data. At this time, the new external data can be stored by clearing and resetting the data previously stored in the register.

Figure 19:
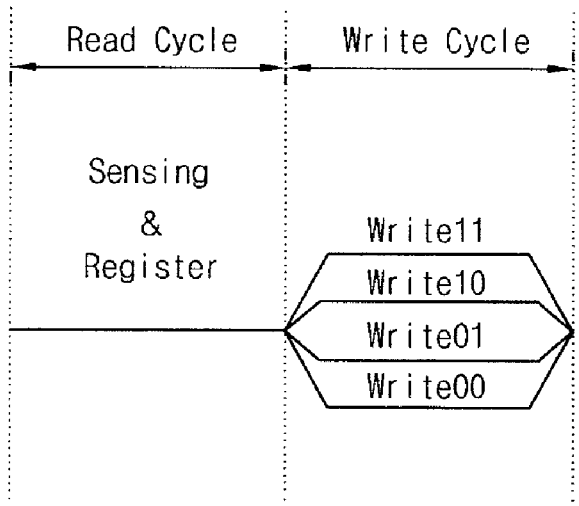
FIG. 19 is a view showing one example of a refresh cycle for the multi bit of FIG. 14.

FIG. 19 is a view showing a refresh method of the 1-transistor type DRAM according to the present invention. The refresh method can be simply performed through the read cycle and the write cycle. That is, in the read cycle period, the cell data are sensed and amplified for all the cells in a row selected and then, are stored in the register. Thereafter, in the write cycle, the data stored in the resister are back written, making it possible to perform the refresh.

Meanwhile, a DRAM cell according to the present invention driven as described above can be constituted as shown in FIG. 20.

Figure 20:
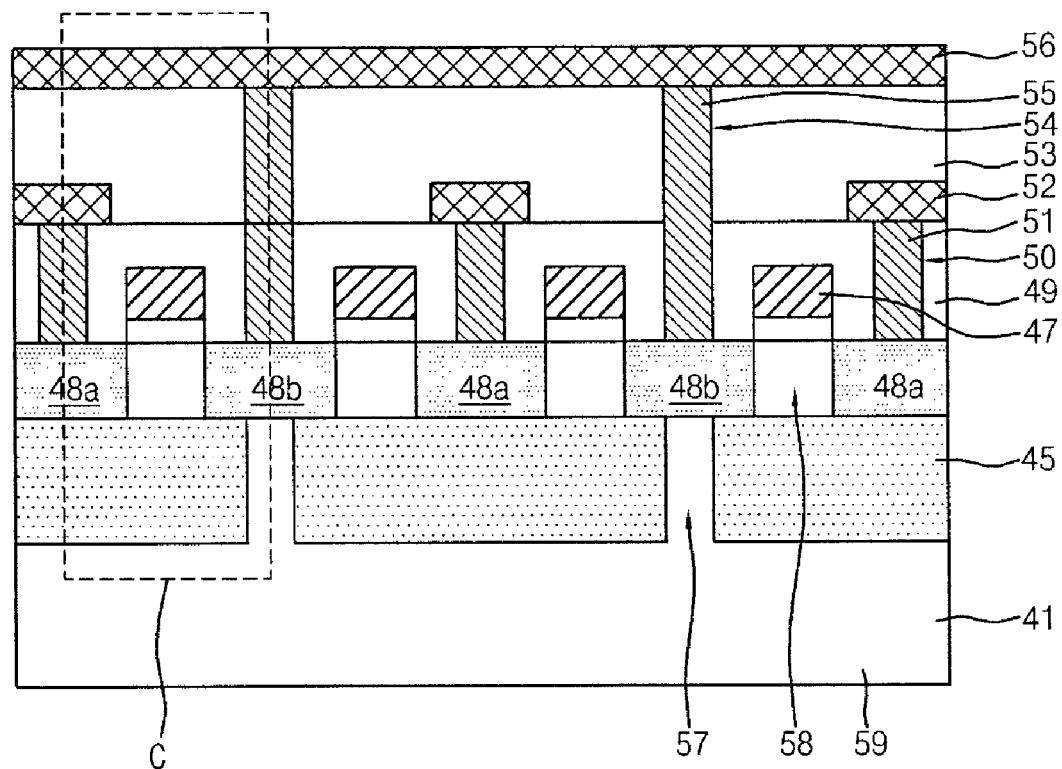
FIG. 20 is a cross-sectional view of a DRAM cell according to the present invention.

Referring to FIG. 20, a plurality of gates 47 are formed on a silicon substrate 41 formed of bulk silicon, first and second junction regions, that is, source/drain regions 48a and 48b, are formed within the substrate surfaces on both sides of the respective gates 47, and an isolating layer 45 contacting the source/drain regions 48a and 48b and isolating between a substrate bulk 59 and a substrate body 58 below the gates 47 is formed within the silicon substrate 41 portion below the source/drain regions 48a and 48b. Herein, it can be appreciated that the gate 50 is formed in a stacked structure of a gate isolating layer and a gate conductive layer.

Continuously, a first interlayer dielectric layer 49 is formed on the silicon substrate 41 to cover the gate 45, a plurality of source lines 52 (or sensing lines) are formed on the first interlayer dielectric layer 49 to be contacted to the respective source regions 48a, respectively, a second interlayer dielectric layer 53 is formed on the first interlayer dielectric layer 49 including the source lines 52, and bit lines 56 are formed on the second interlayer dielectric layer 53 to be contacted to the drain regions 48b. Herein, the source lines 52 and the bit lines 56 each are contacted to the corresponding source region 48a and drain region 48b by means of a first contact plug 51 and a second contact plug 55. Furthermore, one source line 52 and one bit line 56 are formed to be shared between the neighboring DRAM cells.

In a DRAM device of the present invention as described above, a unit cell C is constituted in an 1-transistor structure, the substrate body 58 corresponding to a channel region below the gate 47 is floated likewise a semiconductor device implemented on a SOI wafer of the prior art, and the source region 48a is connected to the substrate bulk 59 by means of a silicon connecting part 57.

Therefore, the DRAM device of the present invention is implemented using the silicon substrate formed of the bulk silicon and is also implemented as a floating body type DRAM cell by making the substrate body have a floated SOI structure so that it can overcome the problems when the SOI wafer of the prior art is applied, having the advantage of the device implemented on the SOI wafer.

Also, the DRAM device of the present invention is constituted by an 1-transistor without a capacitor, differently from a general DRAM device where a unit cell is constituted by an 1-transistor and an 1-capacitor, making it possible to remarkably reduce cell size.

Furthermore, in the DRAM device of the present invention, the 1-transistor floating body type DRAM cell does not destroy the data of the cell in a read operation according to a non destructive read out (NDRO) manner, making it possible to improve reliability and to raise a read speed.

In FIG. 20, non-explained reference numerals 50 and 54 represent the first contact hole and the second contact hole, respectively.

Hereinafter, a method of manufacturing a DRAM device according to the present invention, constituted by a DRAM cell of an 1-transistor as shown in FIG. 20, will be described in detail with reference to FIGS. 21a to 21h.

Figure 21A:
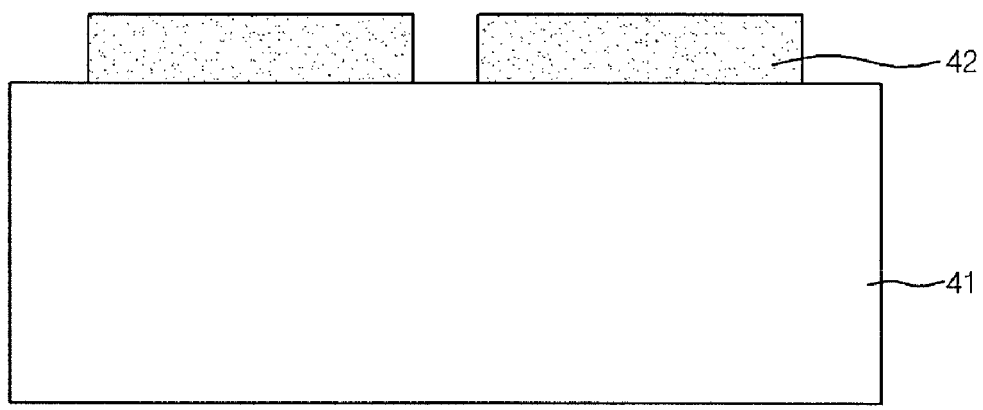
FIGS. 21a to 21h are cross-sectional views per process explaining a manufacturing device of a DRAM cell of FIG. 20.

Referring to FIG. 21a, after a silicon substrate 41 formed of bulk silicon is prepared, an etching mask 42 exposing a portion of the silicon substrate 41 is formed on the silicon substrate 41. Herein, the silicon substrate 41 can be appreciated as a P type substrate and the etching mask 42 can be constituted by a photoresist film or a nitride film and an oxide film, etc.

Figure 21B:
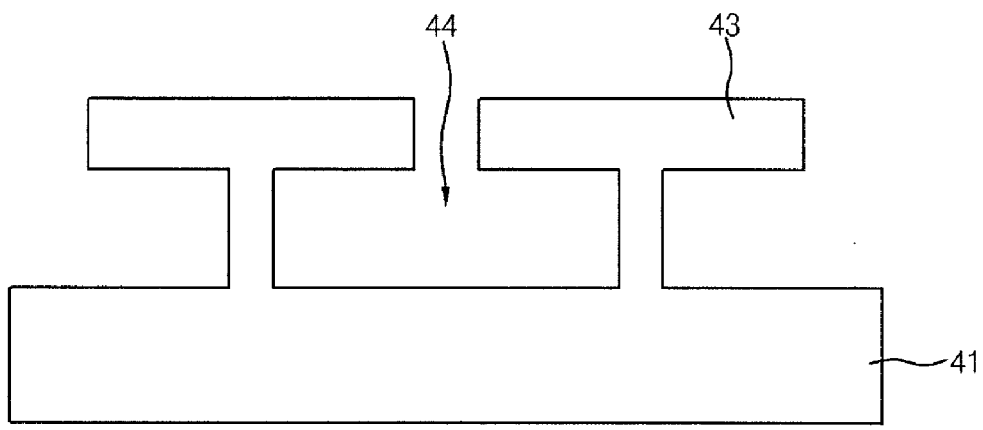

Referring to FIG. 21b, the exposed silicon substrate portion using the etching mask is etched with an equal space, and therethrough, reverse-T type grooves 44 defining T type silicon regions 43 are formed on the silicon substrate 41. Thereafter, the etching mask is removed.

Figure 21C:
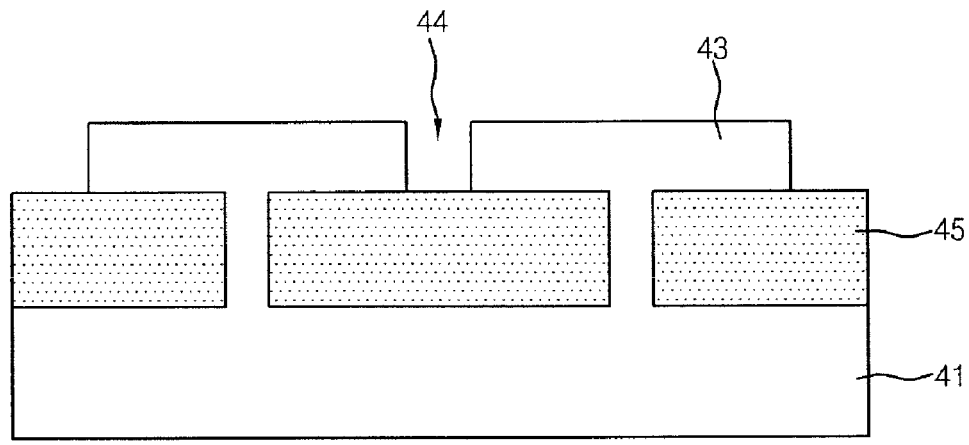

Referring to FIG. 21c, an isolating film is buried within the reverse-T type groove 44, and therethrough, an isolating layer 45 isolating between a substrate body and a substrate bulk is formed. Herein, the formation of the isolating layer 45 can be performed in a manner to form the isolating film on the silicon substrate 41 to bury the reverse-T type groove 44 and then, to etch back the isolating film until the desired portion is removed.

Figure 21D:
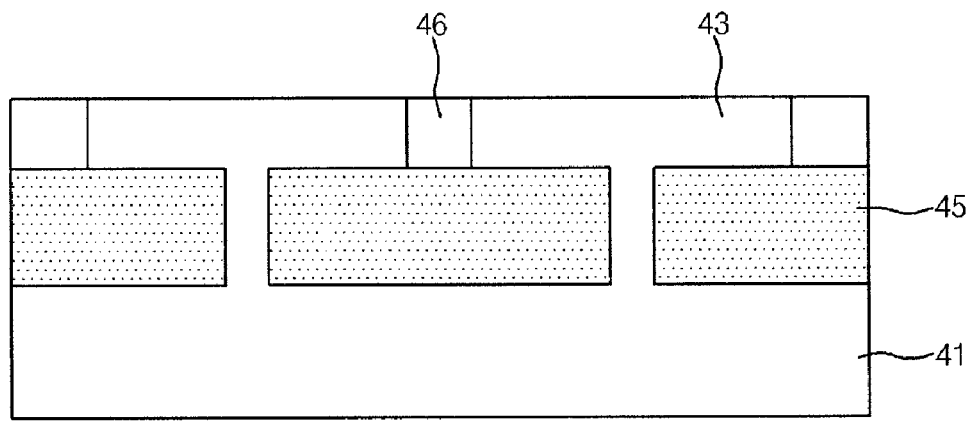

Referring to FIG. 21d, silicon 46 is buried in the reverse-T type groove portion not formed with the isolating layer 45, that is, in the portion between the T type silicon regions 43, with the same thickness as the T type silicon region 43.

Figure 21E:
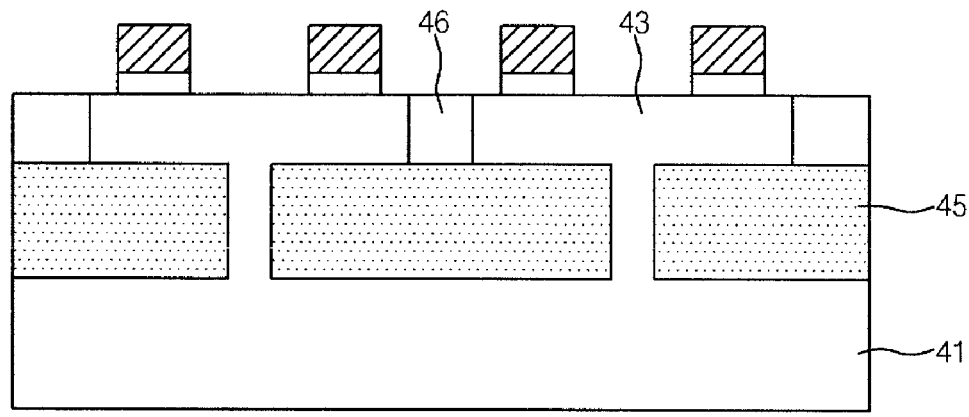

Referring to FIG. 21e, gates 47 formed of a gate isolating layer and a gate conductive layer according to a well-known process are formed on the T type silicon regions 43. At this time, two gates 47 are formed to be arranged on one T type silicon region 43.

Figure 21F:
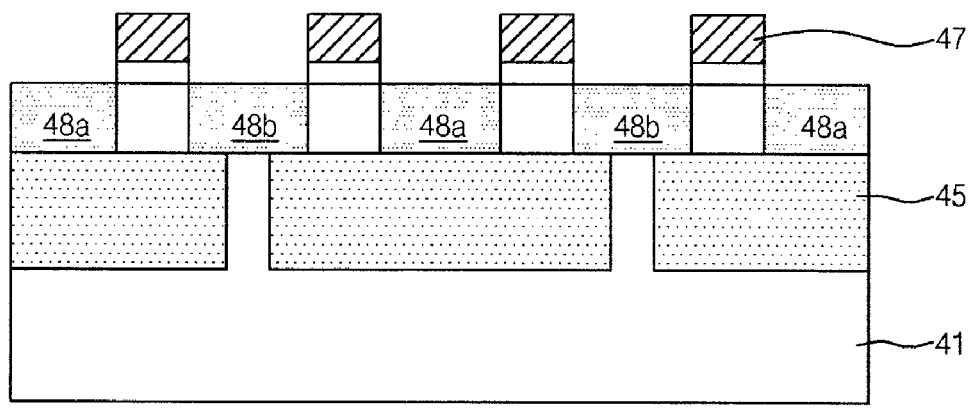

Referring to FIG. 21f, first and second junction regions, that is, source/drain regions 48a and 48b, are formed within the T type silicon region on both sides of the gate 47 by ion-implanting high-concentration N type impurities, for example, arsenic (As) and phosphorus (P), including silicon buried in the upper end of the reverse T-type groove, and therethrough, a cell structure formed of an 1-transistor is formed. Herein, the substrate body 58 corresponding to a channel region below the gate 47 becomes a floating state by means of the isolating layer 45 so that the floated substrate body 58 always represents excellent silicon characteristics.

Meanwhile, the source region 48a is electrically connected to the substrate bulk 59 by means of a silicon connecting part 57 of the T type silicon region so that the source region 48a can be easily applied with substrate bias likewise a general semiconductor device implemented on a silicon substrate.

Figure 21G:
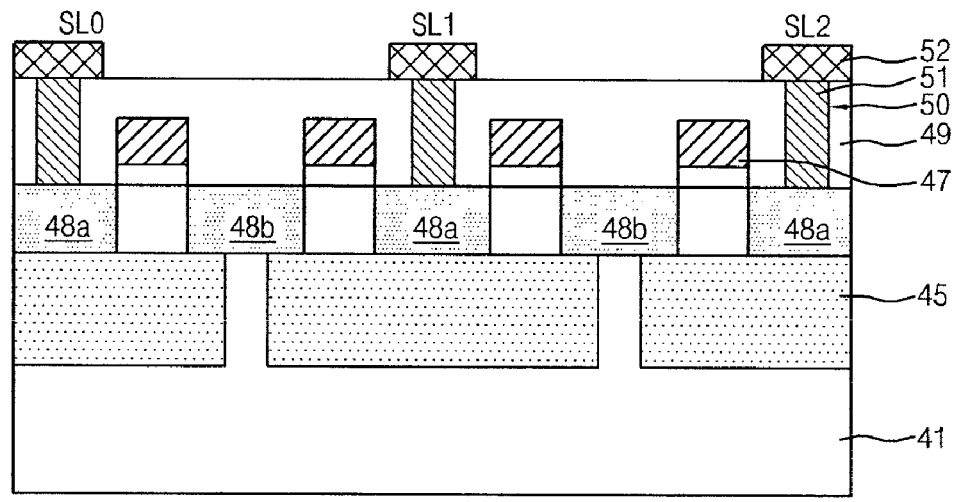

Referring to FIG. 21g, a first interlayer dielectric layer 49 is formed on the silicon substrate 41 formed with the cell structure of the 1-transistor to cover the gates 47. Thereafter, after a plurality of first contact holes 50 exposing the source regions 48a, respectively, are formed by etching the first interlayer dielectric layer 49, conductive layer are buried in the respective first contact holes 50 to form a plurality of first contact plugs 51. Thereafter, a layer for a wiring is deposited and then patterned on the first interlayer dielectric layer 48 so that a source line 52 (or a sensing line) electrically contacted to the corresponding source region 48a through the first contact plugs 51 is formed on the respective first contact plugs 51 and the first interlayer dielectric layer portion adjacent thereto. Herein, the source line 52 including the first contact plugs 51 are formed to be shared by the neighboring unit cells.

Figure 21H:
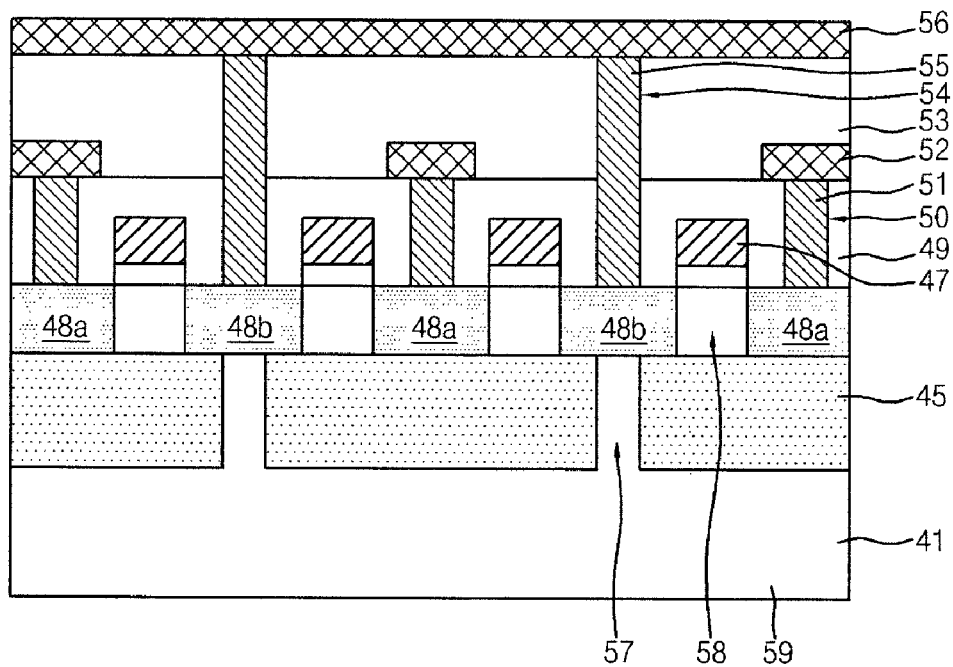

Referring to FIG. 21h, a second interlayer dielectric layer 53 is formed on the first interlayer dielectric layer 49 formed with the source line 52. Thereafter, after a plurality of second contact holes 54 exposing the drain regions 48b, respectively, are formed by etching the second and first interlayer dielectric layers 53 and 49, conductive layer are buried in the respective second contact holes 54 to form a plurality of second contact plugs 55. Thereafter, a layer for a wiring is deposited and then patterned on the second interlayer dielectric layer 53 so that a bit line 56 electrically contacted to the corresponding drain region 48b through the second contact plugs 55 is formed on the second contact plugs 55 and the second interlayer dielectric layer portion adjacent thereto. Herein, the second contact plugs 55 are formed to be shared by the neighboring unit cells.

Thereafter, although not shown, the manufacturing of the DRAM device constituted by DRAM cells in the 1-transistor structure according to the present invention is completed by sequentially performing a series of well-known subsequent processes.

Meanwhile, in the manufacturing method of the DRAM device according to the present invention, the present invention performs the formation of the source line including the formations of the first contact hole and the first contact plug and the formation of the bit line including the formations of the second contact hole and the second contact plug, respectively. However, as another embodiment of the present invention, the contact between the drain region and the bit line can be made in methods simultaneously forming the first contact hole and the first contact plug on the first interlayer dielectric layer on the drain region when forming the first contact hole and the first contact plug, forming the layer for a wiring on the first contact plug formed on the drain region when forming the source line, and forming the second contact hole and the second contact plug contacted to the layer pattern for a wiring within the second interlayer dielectric layer when forming the bit line.

In the present invention, the 1-transistor type floating body type DRAM cell can write and read data at low voltage, and can solve the problem that the data of non-selected cells are destroyed, having an acting effects capable of performing a stable cell operation and a low voltage operation.

And, the present invention implements the floating body type DRAM cell in a SOI structure using a silicon substrate formed of bulk silicon, making it possible to improve the device characteristics to be operated at a high speed and at low voltage.

Also, the present invention implements DRAM cell in a SOI structure using a general silicon substrate, making it possible to overcome lower productivity and difficulties in equipment and process development, which may be caused in applying a SOI wafer.

Furthermore, the present invention constitutes the unit cell with the 1-transistor without a capacitor so that it can remarkably reduce cell size as compared to the general DRAM cell constituted by an 1-transistor and an 1-capacitor, and therethrough, making it possible to implement a highly integrated DRAM device.

In addition, although not specifically explained, the present invention implements the 1-transistor floating body type DRAM cell so that the data of the cell are not described in a read operation according to a non destructive read out (NDRO) manner, making it possible to improve reliability and to raise a read speed.

What is claimed is:

1. A driving circuit of an 1-transistor type DRAM comprising:
   a transistor storing data on a substrate body, the transistor including first and second junction regions formed within a silicon substrate at both sides of a gate; and an isolating layer formed to isolate between a substrate bulk within the silicon substrate below the first and second junction regions and the substrate body below the gate;
   a word line controlling the transistor;
   a sensing line connected to a one of the first and second junction regions;
   a bit line connected to the other of the first and second junction regions;
   a sense amp sensing data on the bit line; and
   a register connected to the bit line.

2. A driving circuit of an 1-transistor type DRAM comprising:
   a transistor storing data on a substrate body, the transistor including first and second junction regions formed within a silicon substrate at both sides of a gate; and an isolating layer formed to isolate between a substrate bulk within the silicon substrate below the first and second junction regions and the substrate body below the gate;

a word line controlling the transistor;

a sensing line connected to one of the first and second junction regions;

a bit line connected to the other of the first and second junction regions;

a sense amp sensing data on the bit line to distinguish multi-level data; and a write driver connected to the sense amp and supplying a plurality of driving voltages to the sense amp.

3. The driving circuit as set forth in claim 2, wherein the multi-level data are the data at different levels driven using a 4-level current.

4. The driving circuit as set forth in claim 2, wherein the plurality of driving voltages are generated using a plurality of reference voltages.

* * * * *